United States Patent
Lin et al.

(10) Patent No.: US 7,745,726 B2
(45) Date of Patent: Jun. 29, 2010

(54) ASSEMBLY STRUCTURE

(75) Inventors: Ming-Te Lin, Hsinchu (TW);
Chin-Yung Chen, Taoyuan County (TW)

(73) Assignee: Raydium Semiconductor Corporation, Hsinchu (TW)

( * ) Notice: Subject to any disclaimer, the term of this patent is extended or adjusted under 35 U.S.C. 154(b) by 65 days.

(21) Appl. No.: 12/125,250

(22) Filed: May 22, 2008

(65) Prior Publication Data
US 2009/0246477 A1 Oct. 1, 2009

(30) Foreign Application Priority Data
Mar. 31, 2008 (TW) ............... 97111649 A

(51) Int. Cl.
*H02G 15/00* (2006.01)
*H01R 9/00* (2006.01)

(52) U.S. Cl. ............. 174/73.1; 174/255; 174/261; 174/74 R; 361/772; 361/774

(58) Field of Classification Search ......... 174/250–255, 174/73.1, 74 R, 261; 428/209, 901; 361/774, 361/772
See application file for complete search history.

(56) References Cited

U.S. PATENT DOCUMENTS

| | | | | |
|---|---|---|---|---|
| 3,499,098 A | * | 3/1970 | Mcgahey et al. | 174/261 |
| 3,678,437 A | * | 7/1972 | Vaden | 439/43 |
| 4,426,548 A | * | 1/1984 | Oritsuki et al. | 174/72 R |
| 5,484,648 A | * | 1/1996 | Odashima et al. | 428/209 |
| 5,672,400 A | * | 9/1997 | Hansen et al. | 428/40.1 |
| 5,965,064 A | * | 10/1999 | Yamada et al. | 252/512 |
| 6,564,450 B2 | * | 5/2003 | Engbring et al. | 29/830 |
| 6,596,947 B1 | * | 7/2003 | Kurita et al. | 174/255 |
| 6,636,000 B2 | * | 10/2003 | Asami et al. | 315/169.3 |
| 6,884,833 B2 | * | 4/2005 | Chheang et al. | 524/445 |

* cited by examiner

*Primary Examiner*—Cathy Lam
(74) *Attorney, Agent, or Firm*—Quintero Law Office

(57) ABSTRACT

An assembly structure is provided. The assembly structure includes a first substrate, a second substrate and a medium layer disposed between the first and second substrates. The medium layer includes a side edge, and the second substrate includes at least one lead wire. When the second substrate is disposed on the medium layer, the lead wire of the second substrate is relatively oblique to the side edge of the medium layer.

10 Claims, 3 Drawing Sheets

ASSEMBLY STRUCTURE

BACKGROUND OF THE INVENTION

1. Field of the Invention

The invention relates to an assembly structure, and more particularly to an assembly structure suitable for being bent several times during the assembly process.

2. Description of the Related Art

For a flexible circuit board connected to a conventional liquid crystal panel, the lead wires of the flexible circuit board are overlapped to electrically connect to the lead wires or contacts of the liquid crystal panel with respect to a side edge thereof, wherein the distributed lead wires of the flexible circuit board are perpendicular to the side edge of the liquid crystal panel. However, because the flexible circuit board must be bent several times during the assembly process of the liquid crystal panel, lead wires of the flexible circuit board may break.

Thus, it is essential to enhance the strength of the lead wires of the flexible circuit board by a more suitable distribution.

BRIEF SUMMARY OF THE INVENTION

The invention provides an assembly structure. An embodiment of the assembly structure comprises a first substrate, a second substrate and a medium layer. The medium layer having a side edge is disposed between the first and second substrates. The second substrate comprises at least one lead wire. When the second substrate is disposed on the medium layer, the lead wire of the second substrate is relatively oblique to the side edge of the medium layer.

The first substrate can be a panel. The second substrate can be a flexible circuit board. The medium layer can be an anisotropic conductive film.

Because the lead wire of the second substrate is relatively oblique to the side edge of the medium layer, the bending angle of the lead wires of the second substrate can be reduced and the strength thereof can be increased, thus, the lifespan of the lead wire of the second substrate can be extended.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
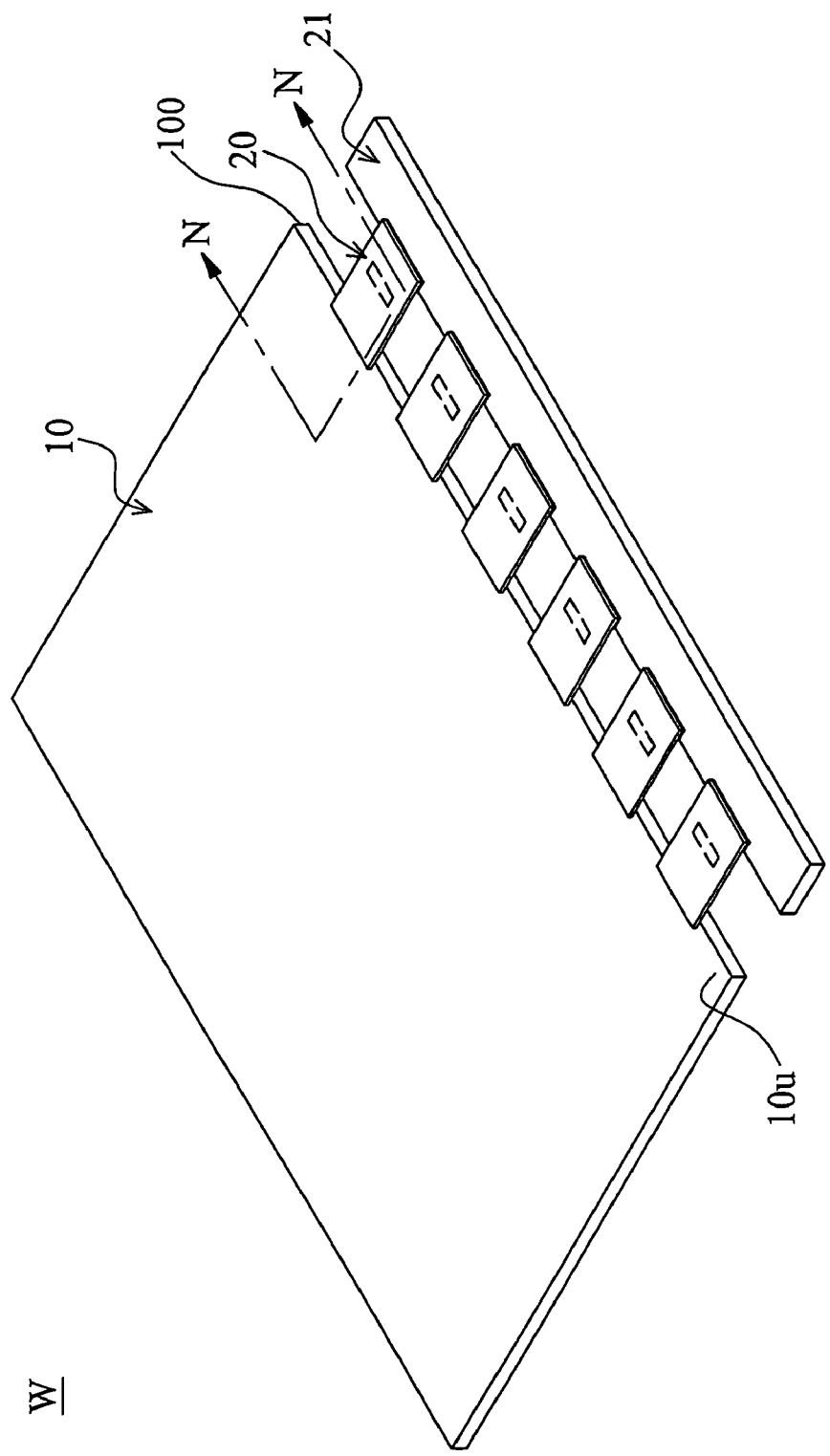
FIG. 1 is a schematic view of an assembly structure of the invention.
Figure 2A:
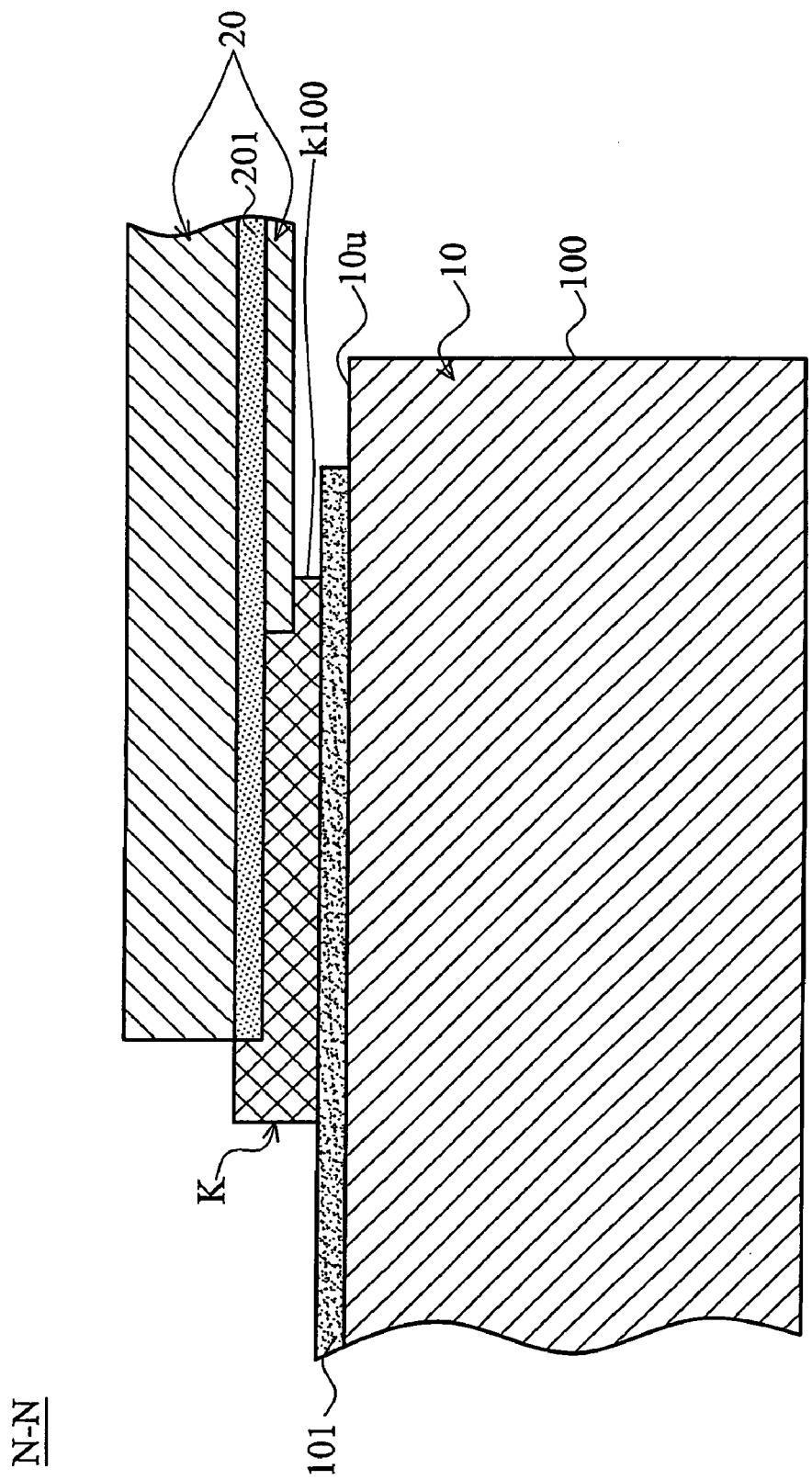
FIG. 2A is a sectional view of the assembly structure along line (N-N) of FIG. 1.
Figure 2B:
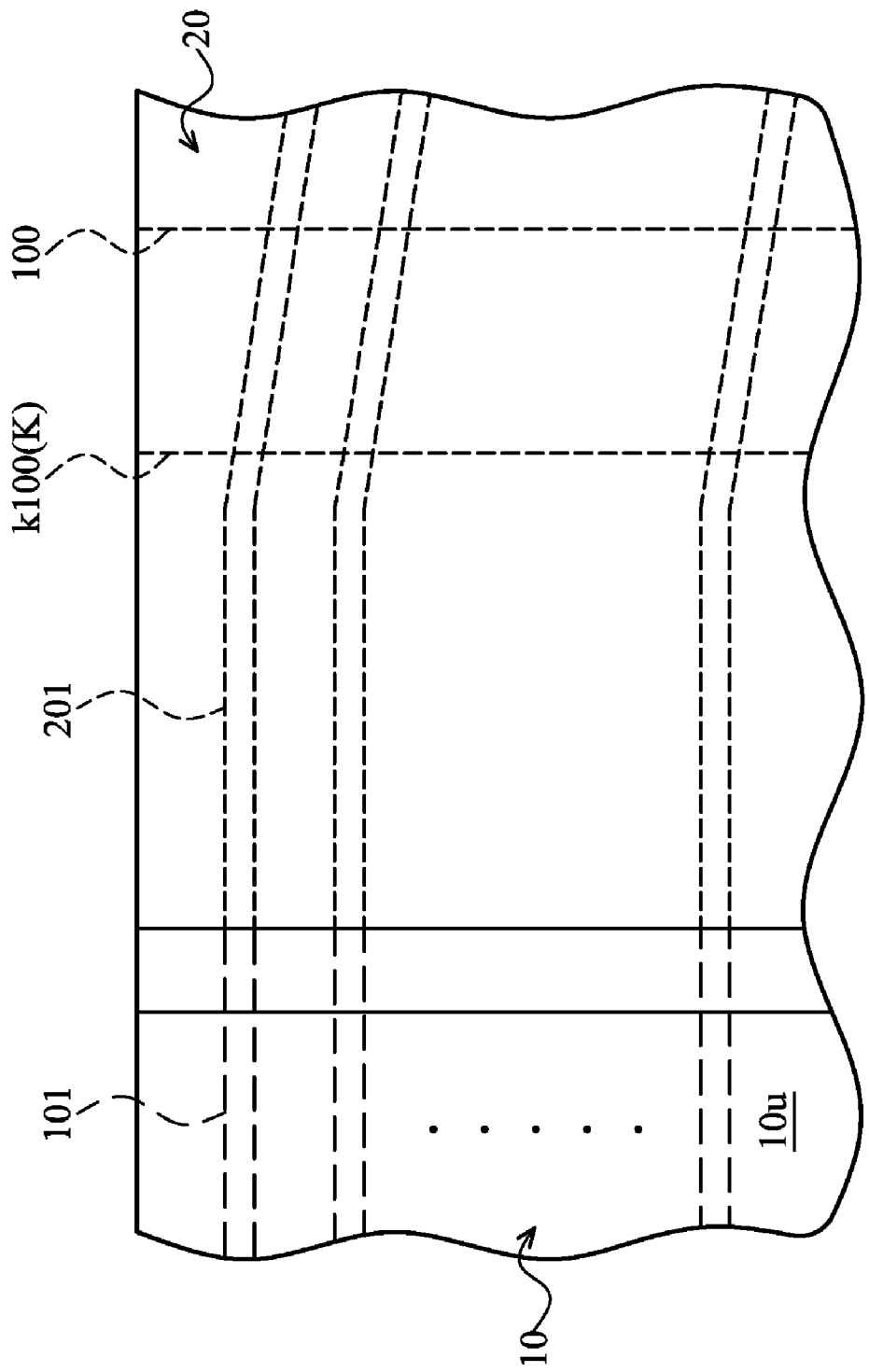
FIG. 2B is a top view of FIG. 2A.

FIG. 1 is a schematic view of an assembly structure W, FIG. 2A is a sectional view of the assembly structure W along line N-N of FIG. 1, and FIG. 2B is a top view of FIG. 2A.

In FIGS. 1 and 2A, the assembly structure W comprises a first substrate 10, a second substrate 20, a medium layer K and a circuit board 21.

In FIGS. 2A and 2B, the first substrate 10 is a rectangular member having a top surface 10u, a side edge 100 and a plurality of lead wires 101 (shown by longer dotted lines). The lead wires 101 are disposed on the top surface 10u and extended toward the side edge 100. In this embodiment, the first substrate 10 is a liquid crystal panel, and the lead wires 101 are metallic wires.

The second substrate 20 comprises a plurality of lead wires 201. The lead wires 201 (shown by shorter dotted lines) of the second substrate 20 are disposed on the medium layer K with respect to the lead wires 101 of the first substrate 10. In this embodiment, the second substrate 20 is a flexible circuit board, e.g., chip on film (COF, and the medium layer K is an anisotropic conductive film.

When the second substrate 20 and the first substrate 10 are connected by the medium layer K, the second substrate 20 is overlapped on the medium layer K by passing through the side edge k100 of the medium layer K, thus, the lead wires 201 of the second substrate 20 and the lead wires 101 of the first substrate 10 are electrically connected. The lead wires 201 of the second substrate 20 projecting on the first substrate 10 have projected sections oblique to the side edge k100 of the medium layer K, i.e., the lead wire 201 of the second substrate 20 are relatively oblique to the side edge k100 of the medium layer K.

When the second substrate 20 is bent several times with respect to the medium layer K, the bending stress of the lead wires 201 of the second substrate 20 can be reduced because the lead wire 201 of the second substrate 20 is relatively oblique to the side edge k100 of the medium layer K. Thus, both the robustness and the lifespan of the lead wire 201 of the second substrate 20 can be enhanced and extended.

Although in the embodiment, the second substrate 20 is overlapped on the medium layer K and the lead wires 201 of the second substrate 20 and the lead wires 101 of the first substrate 10 are electrically connected via the medium layer K, it is not limited thereto. Note that the second substrate can be connected to the first substrate via interposing or clamping in other embodiments, or the lead wires of the first substrate can be replaced by electrical contacts.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An assembly structure, comprising:
   a first substrate;
   a medium layer comprising a side edge; and
   a second substrate disposed on the first substrate, wherein the second substrate comprises at least one lead wire, and the lead wire projecting on the first substrate comprises a projected section passing through the side edge of the medium layer, wherein the projected section is relatively oblique to the side edge of the medium layer.

2. The assembly structure as claimed in claim 1, wherein the first substrate is a panel.

3. The assembly structure as claimed in claim 1, wherein the second substrate is a flexible circuit board.

4. The assembly structure as claimed in claim 1, wherein the medium layer is disposed between the first and second substrates.

5. The assembly structure as claimed in claim 1, wherein the medium layer is an anisotropic conductive film.

6. An assembly structure, comprising:

a first substrate;

a medium layer comprising a side edge, overlapping the first substrate; and a second substrate overlapping the medium layer by passing through the side edge of the medium layer, wherein the second substrate comprises a plurality of lead wires electrically connected to the first substrate via the medium layer, and the lead wires of the second substrate projecting on the first substrate comprise a plurality of projected sections passing through the side edge of the medium layer, wherein the projected sections are oblique to the side edge of the medium layer.

7. The assembly structure as claimed in claim 6, wherein the first substrate is a panel.

8. The assembly structure as claimed in claim 6, wherein the second substrate is a flexible circuit board.

9. The assembly structure as claimed in claim 6, wherein the medium layer is disposed between the first and second substrates.

10. The assembly structure as claimed in claim 6, wherein the medium layer is an anisotropic conductive film.

* * * * *